United States Patent
Ausserlechner

(10) Patent No.: US 10,739,417 B2
(45) Date of Patent: Aug. 11, 2020

(54) SPINNING CURRENT METHOD FOR MAGFET-SENSOR

(71) Applicant: Infineon Technologies AG, Neubiberg (DE)

(72) Inventor: Udo Ausserlechner, Villach (AT)

(73) Assignee: Infineon Technologies AG, Neubiberg (DE)

(*) Notice: Subject to any disclaimer, the term of this patent is extended or adjusted under 35 U.S.C. 154(b) by 421 days.

(21) Appl. No.: 15/598,575

(22) Filed: May 18, 2017

(65) Prior Publication Data
US 2017/0343623 A1 Nov. 30, 2017

(30) Foreign Application Priority Data
May 31, 2016 (DE) .................. 10 2016 109 971

(51) Int. Cl.
*G01R 33/06* (2006.01)
*H01L 29/82* (2006.01)
*G01R 33/07* (2006.01)
*G01R 33/00* (2006.01)
*H01L 29/06* (2006.01)
(Continued)

(52) U.S. Cl.
CPC ....... *G01R 33/066* (2013.01); *G01R 33/0023* (2013.01); *G01R 33/0029* (2013.01); *G01R 33/06* (2013.01); *G01R 33/075* (2013.01); *H01L 29/0692* (2013.01); *H01L 29/41758* (2013.01);
(Continued)

(58) Field of Classification Search
CPC ...... G01R 33/06; G01R 33/066; G01R 33/00; G01R 33/0023; G01R 33/07; G01R 33/0029; H01L 29/423; H01L 29/42376; H01L 29/417; H01L 29/41758; H01L 29/06; H01L 29/0692; H01L 29/78; H01L 29/82

See application file for complete search history.

(56) References Cited

U.S. PATENT DOCUMENTS

| 3,714,559 A | 1/1973 | Bate |
| 5,489,846 A | 2/1996 | Li et al. |

(Continued)

FOREIGN PATENT DOCUMENTS

| CN | 101212016 A | 7/2008 |
| CN | 102608547 A | 7/2012 |

*Primary Examiner* — Son T Le
(74) *Attorney, Agent, or Firm* — Harrity & Harrity, LLP

(57) ABSTRACT

A magnetic-field-sensitive MOSFET (MagFET) is described herein. In accordance with one embodiment, the MagFET comprises a semiconductor body, a first well region arranged in the semiconductor body and being doped with dopants of a first doping type, and a number of N contact regions arranged in the first well region and doped with dopants of a second doping type, which is complementary to the first doping type, wherein N is equal to or greater than three. A gate electrode covers the first well region between the contact regions. The gate electrode is separated from the first well region by an isolation layer and is configured to control a charge carrier density in the first well region between the contact regions dependent on a voltage applied at the gate electrode. The first well region has a center of symmetry and the contact regions are arranged rotationally symmetric with respect to the center of symmetry with a rotational symmetry of order N.

20 Claims, 7 Drawing Sheets

(51) Int. Cl.
*H01L 29/417* (2006.01)
*H01L 29/423* (2006.01)
*H01L 29/78* (2006.01)

(52) U.S. Cl.
CPC ........ *H01L 29/42376* (2013.01); *H01L 29/78* (2013.01); *H01L 29/82* (2013.01)

(56) References Cited

U.S. PATENT DOCUMENTS

| | | |
|---|---|---|
| 9,470,552 B2 | 10/2016 | Ausserlechner |
| 2003/0206011 A1* | 11/2003 | Doyle .................... G01R 33/06 324/252 |
| 2009/0237074 A1 | 9/2009 | Kuo et al. |
| 2012/0007598 A1 | 1/2012 | Lo et al. |
| 2012/0200290 A1* | 8/2012 | Ausserlechner ..... G01R 33/075 324/251 |

* cited by examiner

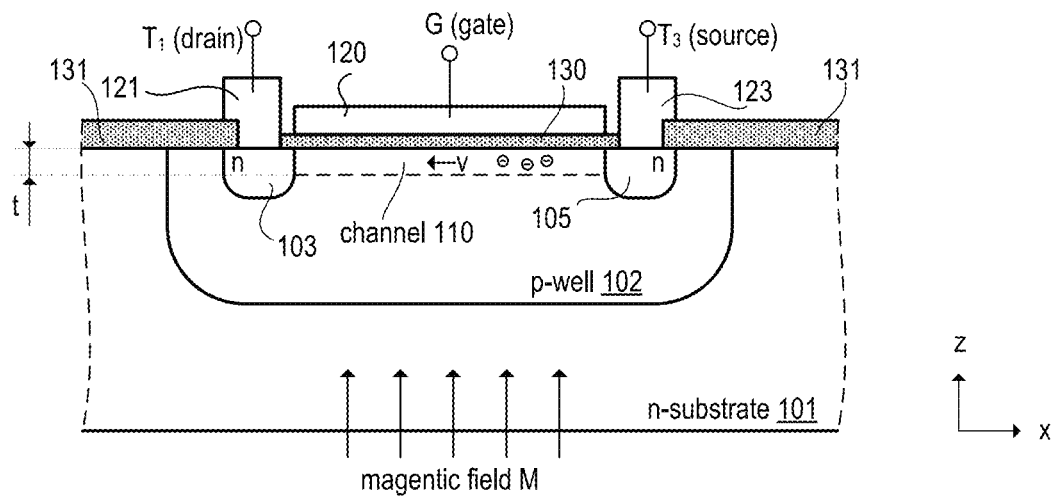
Fig. 1 (section A-A)
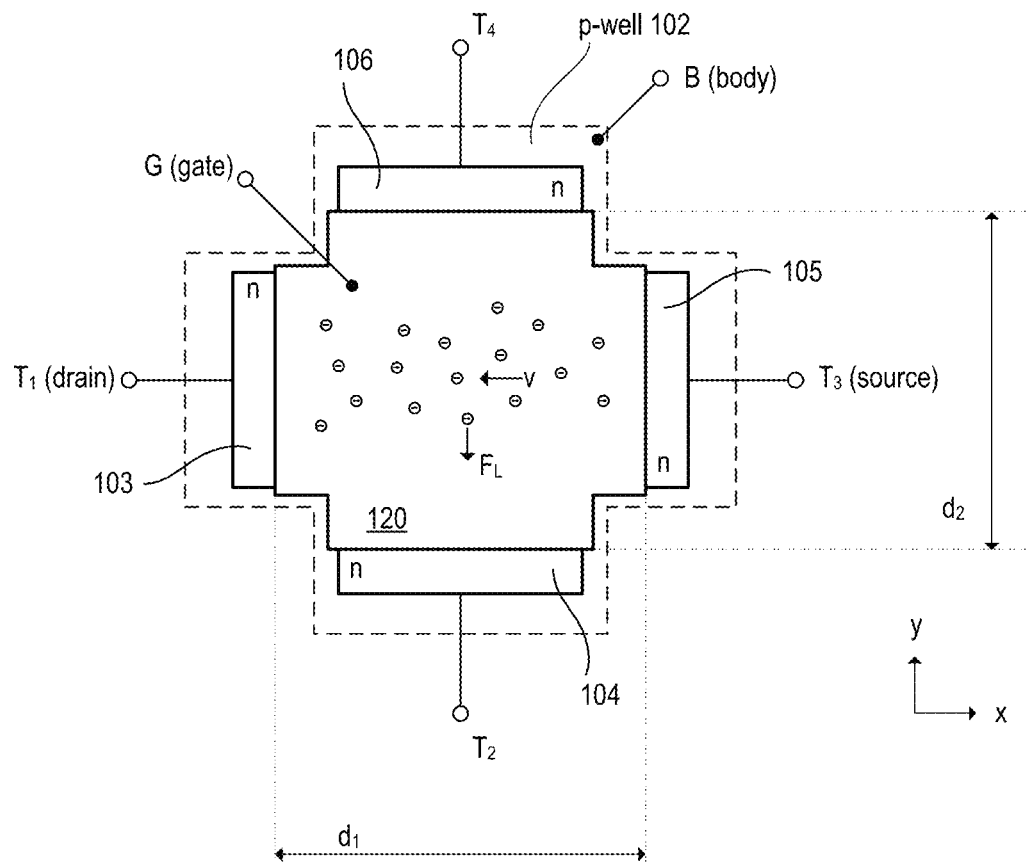
Fig. 2

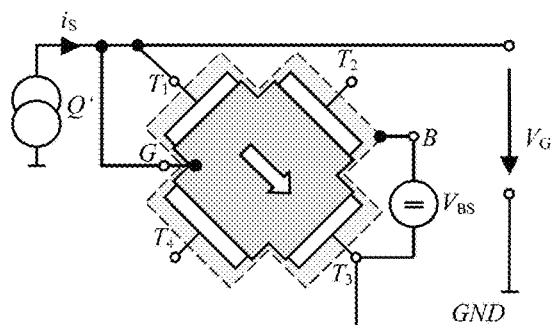
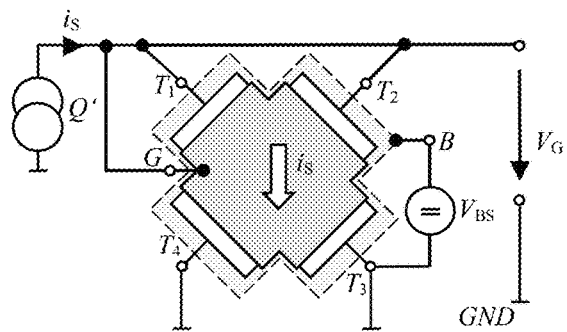
Fig. 10A
Fig. 10B
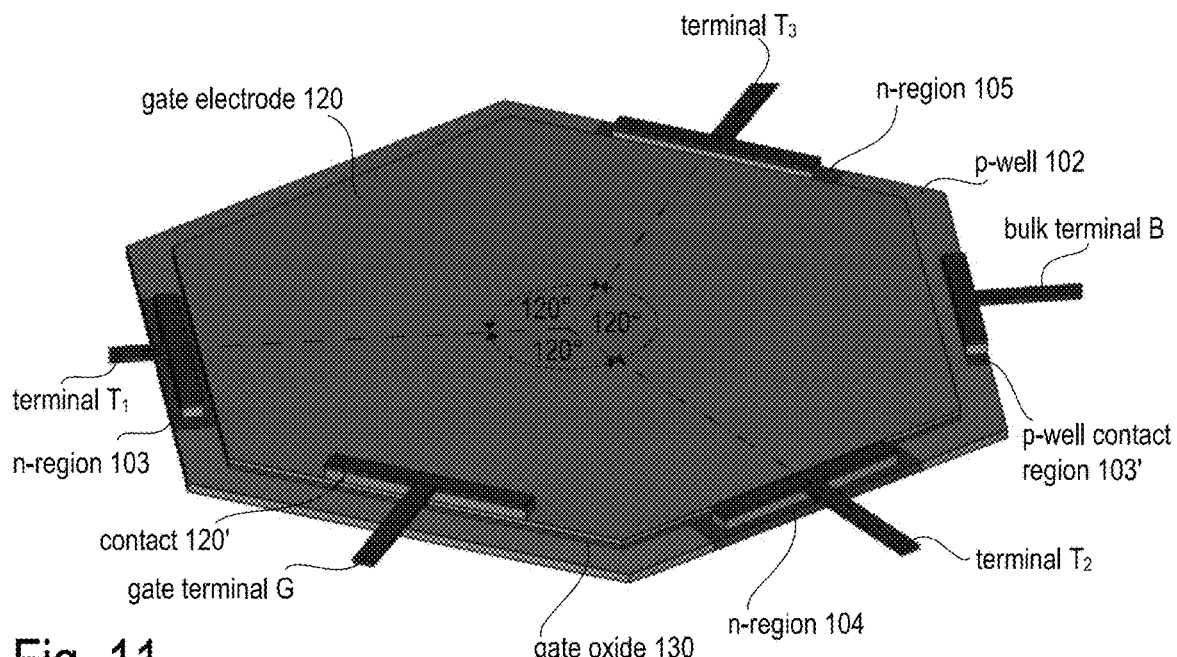
Fig. 11
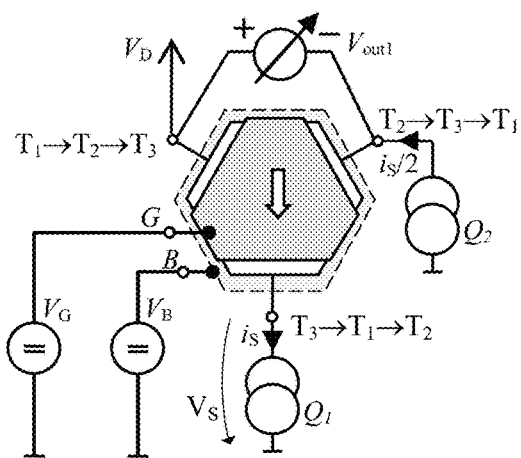
Fig. 12   $1^{st}$ conf. → $2^{nd}$ conf. → $3^{rd}$ conf.

us 10,739,417 B2

SPINNING CURRENT METHOD FOR MAGFET-SENSOR

RELATED APPLICATION

This application claims priority under 35 U.S.C. § 119 to German Patent Application No. 102016109971.6, filed on May 31, 2016, the content of which is incorporated by reference herein in its entirety.

TECHNICAL FIELD

The invention relates to the field of sensor technology, particularly to magnetic-field-sensitive MOSFETs (so-called MagFET), which can be used as magnetic field sensors.

BACKGROUND

A magnetic field sensitive MOSFET (usually referred to as MagFET) is a magnetic field sensor, which makes use of the deflection of the current passing through the MOS channel of a MagFET caused by a magnetic field. This deflection is caused by the Lorentz force acting on the charge carriers in the MOS channel. In so-called split-drain MagFETs a source current of the MagFET is split into two drain currents, wherein the ratio between the drain currents depends on the external magnetic field. In other MagFET designs a voltage drop along a transverse direction with respect to the direction of the current flow through the MOS channel can be tapped. The magnitude of the voltage drop depends on the Lorentz force acting on the charge carriers (electrons in case of an n-channel MagFET) and thus the voltage drop can be evaluated to measure the magnetic field.

There is a general need for magnetic field sensors including MagFETs and suitable sensor circuit for controlling the operation of the sensor and processing the sensor signal.

SUMMARY

A method for operating a magnetic-field-sensitive MOSFET (MagFET) is described herein. In accordance with one exemplary embodiment the MagFET has a gate terminal, a bulk terminal and at least three load terminals operably coupled to a biasing circuit, and the method comprises: alternately connecting the biasing circuit and the MagFET in a first and at least in a second configuration to operate the MagFET in a first and, respectively, at least a second operating mode; tapping an output voltage at the MagFET in the first and the second operating mode; combining the output voltages tapped at the MagFET in the first and the second operating mode; and maintaining at least one of the following voltages constant throughout changes of the operating mode: a gate-bulk voltage between the gate terminal and the bulk terminal and a drain-gate voltage between a load terminal that acts as drain terminal and the gate terminal.

Furthermore, a magnetic field sensor is described herein. In accordance with one exemplary embodiment the magnetic field sensor comprises a magnetic-field-sensitive MOSFET (MagFET), which has a gate terminal, a bulk terminal and at least three load terminals, and a biasing circuit that is configured to be connected to the MagFET in a first and at least in a second configuration to operate the MagFET in a first and, respectively, at least a second operating mode. The biasing circuit comprises electronic switches for reconfiguring the biasing circuit when changing from one of the operating modes into another operating mode. An evaluation circuit is configured to combine output voltages tapped at the MagFET in the first and the second operating mode to obtain a measured value representing the magnetic field. The biasing circuit is configured to provide a constant voltage value for at least one of the following voltages throughout the first and the second operating mode: a gate-bulk voltage between the gate terminal and the bulk terminal and a drain-gate voltage between a load terminal that acts as drain terminal and the gate terminal.

Moreover, a magnetic-field-sensitive MOSFET (MagFET) is described herein. IN accordance with one embodiment, the MagFET comprises a semiconductor body, a first well-region arranged in the semiconductor body and being doped with dopants of a first doping type, and a number of N contact regions arranged in the first well region and doped with dopants of a second doping type, which is complementary to the first doping type, wherein N is equal to or greater than three. A gate electrode covers the first well region between the contact regions. The gate electrode is separated from the first well region by an isolation layer and is configured to control a charge carrier density in the first well region between the contact regions dependent on a voltage applied at the gate electrode. The first well region has a center of symmetry and the contact regions are arranged rotationally symmetric with respect to the center of symmetry with a rotational symmetry of order N.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings:

FIG. 1 illustrates a sectional view of one exemplary MagFET sensor with four terminals.

FIG. 2 illustrates a top view of the exemplary MagFET sensor of FIG. 1.

FIGS. 3A-3B illustrate a perspective view of another exemplary MagFET sensor with four terminals, wherein FIG. 3B shows a detail of FIG. 3A.

FIGS. 10A-10B illustrate two different exemplary implementations of a voltage source for providing a gate voltage in the sensor circuit of FIG. 9.

FIG. 11 illustrate a perspective view of an alternative example of a MagFET sensor with three terminals.

FIG. 12 illustrates a first example of a sensor circuit including the MagFET of FIG. 11 and a respective biasing circuit for the MagFET.

DETAILED DESCRIPTION

Figure 3A:
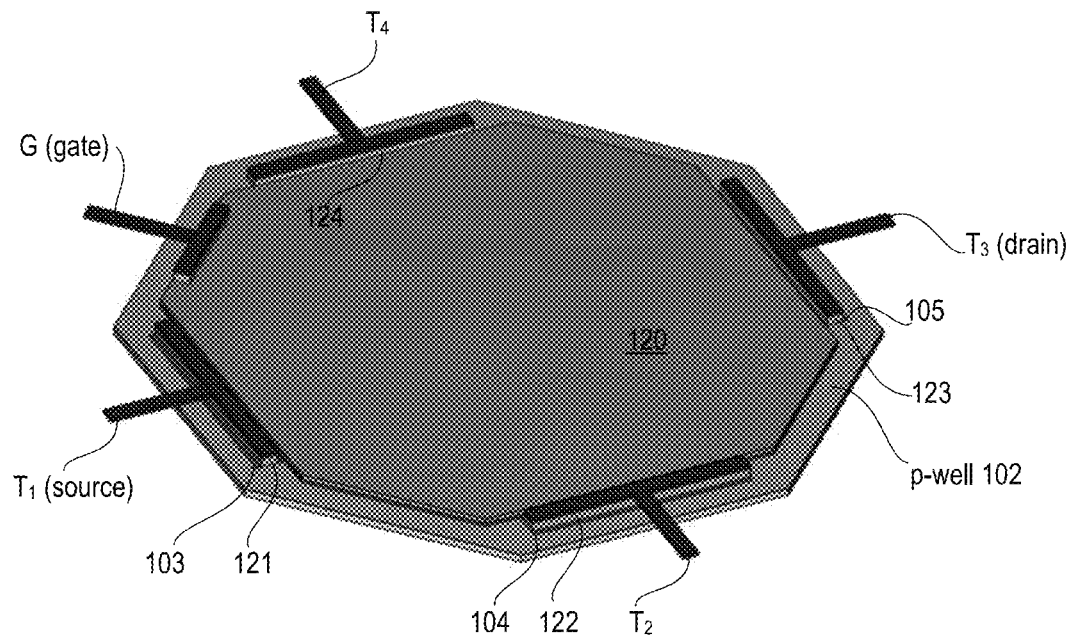

FIG. 1 illustrates one exemplary embodiment of a magnetic field sensitive MOSFET (herein referred to as MagFET). FIG. 1 is a simplified sectional view which illustrates a section through a semiconductor body 100, which may be, for example, a silicon substrate 101. FIG. 2 illustrates a corresponding top view. Dependent on the manufacturing process, the silicon body 100 may include an epitaxial layer (not shown) deposited on the silicon substrate 101. MagFETs are usually n-channel MOSFETs (because the charge carrier mobility is significantly higher for electrons as compared with holes). However, MagFETs may also be implemented as p-channel MOSFETs dependent on the actual application and the manufacturing process. Although the exemplary embodiments shown herein relate to n-channel devices, the present disclosure is not limited thereto. n-channel MagFETs may be formed in a p-doped substrate or within a p-doped well region (short p-well) which is formed in an n-doped substrate for example using ion implantation, diffusion of dopants or any other known doping technique.

In the exemplary embodiment illustrated in FIG. 1, the MagFET device is integrated in p-well 102, which is arranged in the silicon substrate 101, which is n-doped. The p-well 102 extends along a top surface of the semiconductor body 100 and includes at least three (in the present example four) n-doped regions 103, 104, 105, and 106 (see also top view of FIG. 2). Dependent on the electrical connection of the n-doped regions 103, 104, 105, and 106, two of the n-doped regions 103, 104, 105, and 106, may take over the function of a drain region and a source region, respectively. In the example of FIG. 1, region 103 is electrically connected with a drain terminal (terminal $T_1$) and region 105 is connected to a source terminal (terminal $T_3$). These electrical connections may be formed by a structured wiring layer (e.g., made of metal or polysilicon). In the example of FIG. 1, terminal $T_1$ is connected to region 103 by metal contact 121 and terminal $T_3$ is connected to region 105 by metal contact 123. An oxide layer 131 may isolate the surface of the semiconductor body 100 from the metal contacts 121, 122, 123, 124 offside from the n-doped regions 103, 104, 105, and 106.

A gate electrode 120 (e.g. a metal or polycrystalline silicon electrode) is arranged on the top surface of the semiconductor body 100 between the n-doped regions 103, 104, 105, and 106. The gate electrode 120 is electrically connected with the gate terminal G. The gate electrode 120 is isolated from the subjacent semiconductor body by the gate oxide layer 130. The electric potential of the gate electrode can be set by applying a specific voltage (gate voltage) at the gate terminal G. A further terminal B (see FIG. 2, not shown in FIG. 1) is electrically connected to the p-well 102. The electric potential of the p-well 102 can thus be set by applying a specific voltage (bulk voltage) at the terminal B.

FIG. 2 is a top view of the MagFET of FIG. 1. As can be seen from FIG. 2, the n-doped regions 103 and 105 (connected to terminals $T_1$ and $T_3$) are arranged along a first direction (x-direction) at a distance $d_1$, and the n-doped regions 104 and 106 (connected to terminals $T_2$ and $T_4$) are arranged along a second direction (y-direction, perpendicular to the x-direction) at a distance $d_2$. Thus a symmetric sensor set-up is formed. Dependent on the mode of operation, terminals $T_1$ and $T_3$ are used as load terminals (drain and source terminals, respectively), while terminals $T_2$ and $T_4$ are used as sense terminals, or terminals $T_2$ and $T_4$ are used as load terminals (drain and source terminals, respectively), while terminals $T_1$ and $T_3$ are used as sense terminals. The mentioned operating modes will be explained on more detail later with reference to FIGS. 4 to 9. The x-, y- and z-directions define a Cartesian coordinate system. In the further discussion, terminals that are used as drain or source terminals in at least one operating mode are referred to as load terminals. Of course a load terminal can be used as sense terminal to measure an output voltage (simultaneously or alternatingly to its function of providing or sinking load current).

When the gate electrode 120 is charged by applying a positive voltage difference between the gate terminal G and the bulk terminal B, a so-called depletion layer by forcing the positively charged holes of the p-well 102 away from the gate-oxide layer 130, leaving exposed a carrier-free region of immobile, negatively charged acceptor ions. If the positive voltage difference between the gate terminal G and the bulk terminal B is high enough (higher than the threshold voltage of the MagFET), a high concentration of negative charge carriers creates a so-called inversion layer (i.e. the MOS-channel) located in a thin layer (referred to as the channel region 110) next to the interface between the semiconductor body 100 and the gate oxide layer 130.

When the MagFET sensor device is exposed to an external magnetic field as shown in FIG. 1 (magnetic flux density B in z-direction) while a drain-source current $i_S$ is passing through the channel region 110 (see FIGS. 1 and 2, electron drift velocity v) in the x-direction (e.g. from region 103 to region 105), a Lorentz force $F_L$ acts on the electrons in the channel. The Lorenz force $F_L$ acting on a specific electron can be calculated as $F_L = e \cdot (v \times B)$, wherein $v \times B$ is the cross-product of the flux density vector B and the drift velocity vector v (for the specific electron), and e denotes the electron charge (approx. $-1.6 \times 10^{-19}$ C). The displacement of the electrons caused by the Lorentz force $F_L$ gives rise to an electric field along the second direction (perpendicular to the magnetic field and the motion of the electrons) and thus, in the present example, to a voltage drop $V_{OUT}$ between the n-doped regions 104 and 106. One can show that the voltage drop $V_{OUT}$ equals $i_S \cdot B/(t \cdot n \cdot e)$, wherein is denotes the source-current passing through the channel region 110, t denotes the thickness of the channel region 110 (inversion layer) and n denotes the electron density in the channel region 110. The parameters t and n depend inter alia on the voltage applied at the gate terminal G and the bulk terminal B as well as on material parameters such as the concentration of dopants in the p-well 102.

Figure 3B:
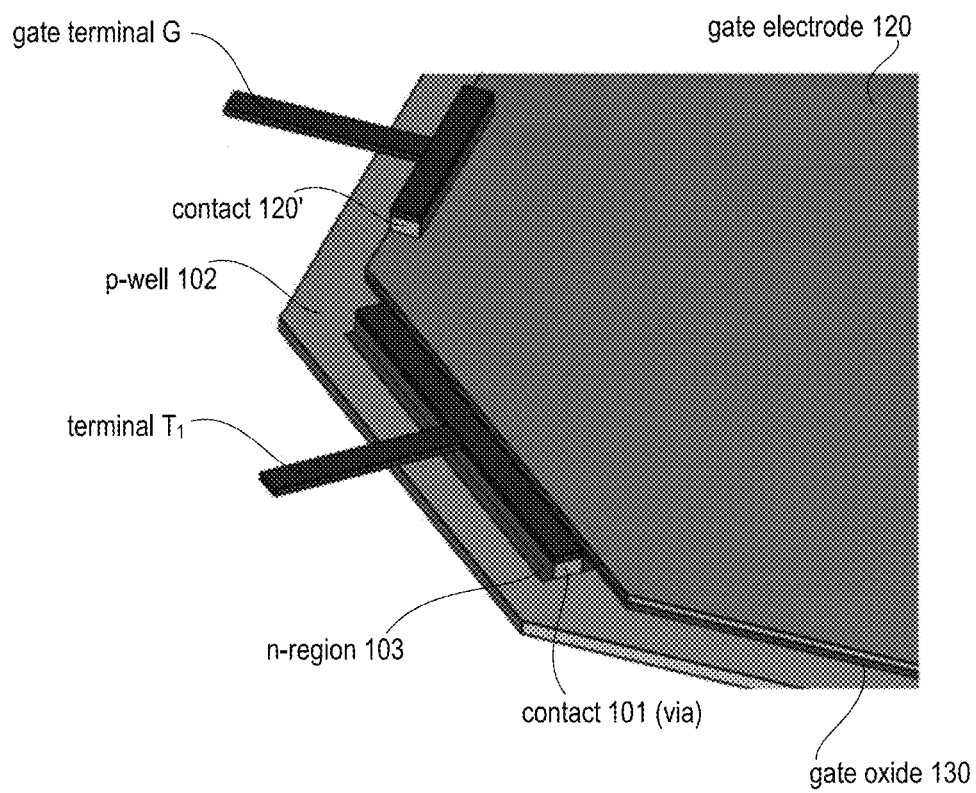

FIGS. 3A-3B illustrate an alternative embodiment of the MagFET shown in FIGS. 1 and 2. FIG. 3A is a perspective view and FIG. 3B is a detail of the left portion of the MagFET. The corresponding sectional view would look very similar to the cross-section of FIG. 1. However, the layout (top view) is different in the present example. Accordingly, the MagFET and particularly the gate electrode 120 have substantially octagonal shapes. The four n-doped regions 103, 104, 105, 106, which are connected to the load/sense terminals $T_1$, $T_2$, $T_3$, $T_4$, are arranged at opposing sides of the octagonal gate electrode as shown in FIG. 3A. In the magnified view of FIG. 3B one can also see how the contact 101 (e.g. a via) is connected to the surface of the semiconductor body 100 on top of the n-doped region 103. Furthermore, the electrical connection between the gate terminal G and the octagonal gate electrode is also shown in FIG. 3B. The gate electrode 120 is contacted along one edge of the octagon between terminals $T_1$ and $T_4$. However, it is understood, that the specific implementation of the contacts and the wiring of the terminals is not important for the further explanations and can be made in any conventional manner using any suitable semiconductor manufacturing technology. Furthermore, it is noted that the p-well 102 may have an octagonal layout as shown in FIG. 3A. However, other layouts may also be applicable.

FIGS. 4 to 9 illustrate six similar but different exemplary circuits for operating (biasing) a MagFET 1 with four load/sense terminals $T_1$, $T_2$, $T_3$, $T_4$ connected to two pairs of opposing n-doped regions, regions 103 and 105 and, respectively, regions 104 and 106, which are electrically coupled by the channel region 110, when the gate electrode is charged due to a proper biasing of the MagFET. That is, the channel region 110 provides an ohmic (resistive) connection between the four load/sense terminals $T_1$, $T_2$, $T_3$, $T_4$. The circuits shown in FIGS. 4 to 9 include a MagFET having a layout as shown in FIG. 2. However, a MagFET with an octagonal layout as shown in FIG. 3A may also be used. Other layouts may also be applicable.

The left circuit diagrams of FIGS. 4 to 9 illustrate the MagFET 1 in a first configuration for a first operating mode, whereas the corresponding right circuit diagrams of FIGS. 4 to 9 illustrate the MagFET 1 in a second configuration for a second operating mode. Electronic switches, which are not shown in the figures to keep the illustrations simple, may be used to switch between the first and second configurations. Each of the embodiments of FIGS. 4 to 9 shows a different implementation of the biasing of the MagFET during operation. It is understood that a small voltage drop may occur across the mentioned electronic switches. However, these voltage drops are neglected as they are not relevant for the following explanations. In fact, these voltage drops reduce the effective supply voltage $V_D$ by a small amount.

Figure 4:
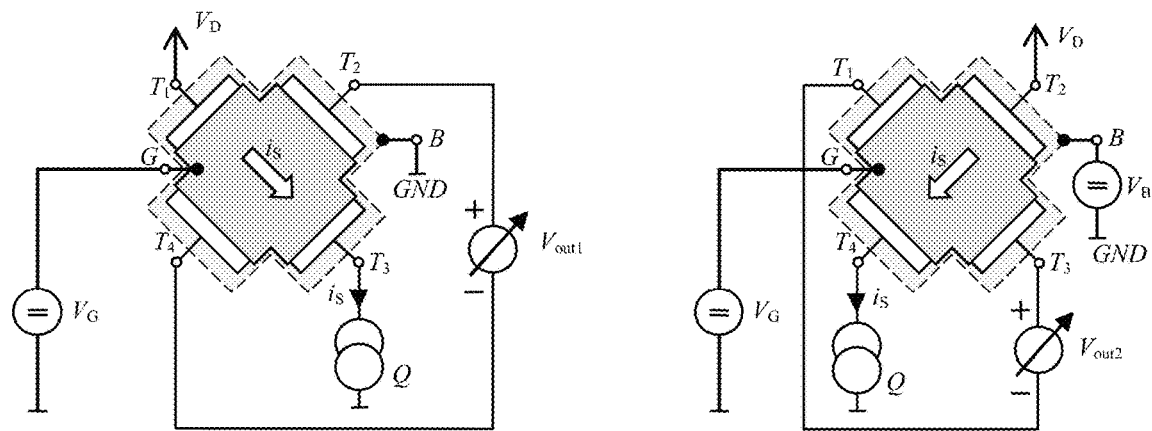
FIG. 4 illustrates a first example of a sensor circuit including the MagFET of FIG. 3A and a respective biasing circuit for the MagFET.

In the example of FIG. 4, the source-current $i_S$ (channel current) is set by a current source Q and the gate-voltage $V_G$ is provided by a voltage source connected to the gate terminal G. The bulk terminal B is connected to ground potential GND. In the first configuration (left diagram of FIG. 4), terminal $T_1$ is supplied with supply voltage $V_D$ and current source Q is connected between terminal $T_3$ (opposing terminal $T_1$) and ground potential GND. The channel current $i_S$ flows substantially from terminal $T_1$ to terminal $T_3$. The arrow indicates the global direction of the current flow. The output voltage $V_{out1}$, which depends on the magnetic flux density B (see FIG. 1), can be tapped between terminals $T_2$ and $T_4$. In the second configuration (right diagram of FIG. 4), terminal $T_2$ is supplied with a supply voltage $V_D$ and current source Q is connected between terminal $T_4$ (opposing terminal $T_2$) and ground potential GND. The channel current $i_S$ flows substantially from terminal $T_2$ to terminal $T_4$. In the examples described herein, the magnitude of the sensor current $i_S$ (source current, channel current) is the same in both operating modes shown in left and right diagram of FIG. 4. The arrow indicates the global direction of the current flow, which is substantially rotated by 90° as compared to the first configuration. The output voltage $V_{out2}$, which depends on the magnetic flux density B, can be tapped between terminals $T_1$ and $T_3$.

Figure 5:
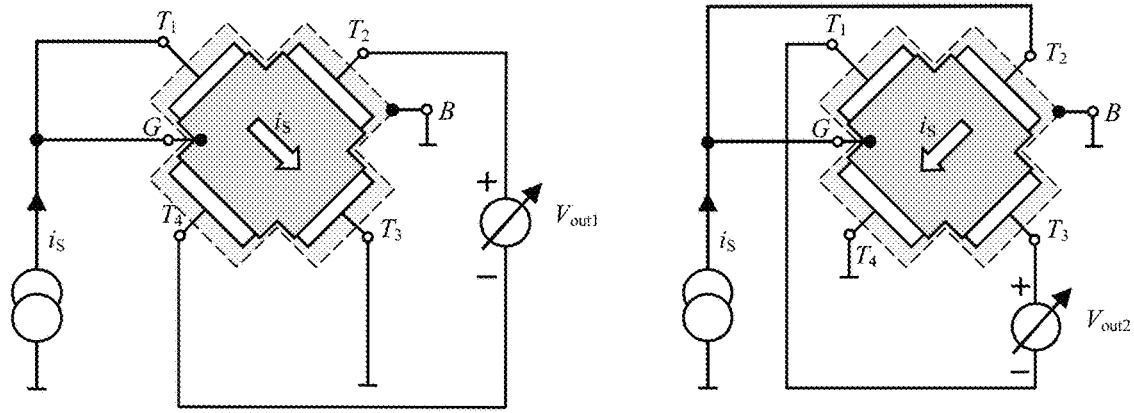
FIG. 5 illustrates a second example of a sensor circuit including the MagFET of FIG. 3A and a respective biasing circuit for the MagFET.

In the example of FIG. 5, the source-current $i_S$ (channel current) is set by a current source Q, which is connected to the drain of the MagFET 1. The gate-voltage $V_G$ is equal to the drain voltage, as the gate terminal is connected with the drain terminal (terminal $T_1$ in the first configuration and terminal T2 in the second configuration). No separate voltage source for biasing the gate electrode is needed in this example. The bulk terminal B is connected to ground potential GND. In the first configuration (left diagram of FIG. 5), the current source Q is connected between terminal $T_1$ and ground potential, while gate terminal G is short-circuited to terminal $T_1$. Thus, the current source Q generates a gate voltage $V_G$, which is high enough that the MagFET is able to sink the sensor current $i_S$ provided by the current source Q. Terminal $T_3$ (opposing terminal $T_1$) is connected to ground potential. The channel current $i_S$ flows substantially from terminal $T_1$ to terminal $T_3$. The arrow indicates the global direction of the current flow. The output voltage $V_{out1}$, which depends on the magnetic flux density B (see FIG. 1), can be tapped between terminals $T_2$ and $T_4$. In the second configuration (right diagram of FIG. 5), the current source Q is connected between terminal $T_2$ and ground potential, while gate terminal G is short-circuited to terminal $T_2$. Again, the current source Q generates a gate voltage $V_G$, which is high enough that the MagFET is able to sink the sensor current $i_S$ provided by the current source Q. Terminal $T_4$ (opposing terminal $T_2$) is connected to ground potential. The channel current $i_S$ flows substantially from terminal $T_2$ to terminal $T_4$. The arrow indicates the global direction of the current flow. The output voltage $V_{out2}$, which depends on the magnetic flux density B (see FIG. 1), can be tapped between terminals $T_1$ and $T_3$.

Figure 6:
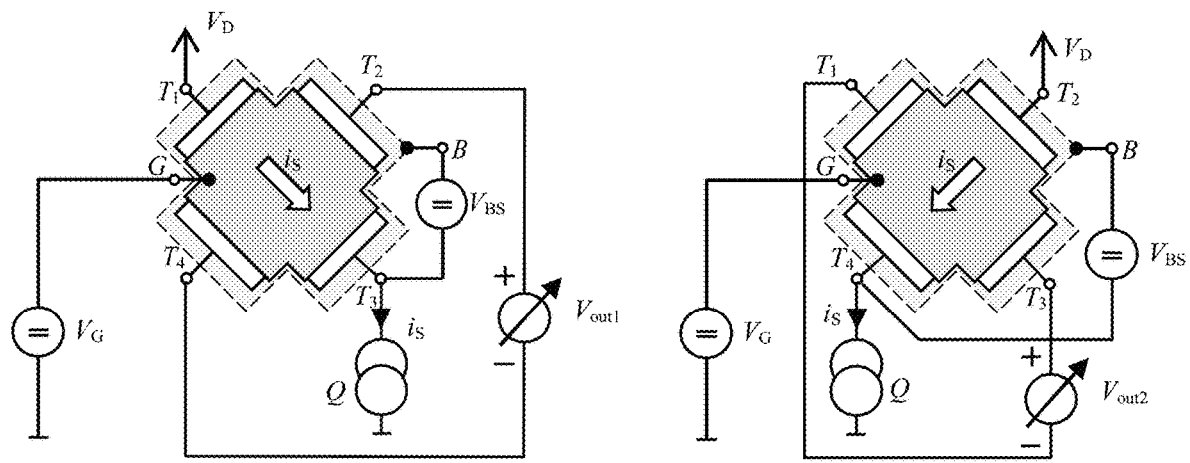
FIG. 6 illustrates a third example of a sensor circuit including the MagFET of FIG. 3A and a respective biasing circuit for the MagFET.

The example of FIG. 6 is essentially the same as the example of FIG. 4. However, the example of FIG. 6 includes an additional current source to bias the p-well 102. This biasing may be accomplished by connecting a further voltage source between the bulk terminal B and the source terminal, which is terminal $T_4$ in the first configuration (right diagram of FIG. 6) and terminal $T_3$ in the second configuration (left diagram of FIG. 6). The further voltage source applies a voltage $V_{BS}$ between the bulk terminal B and the source terminal. In one specific example the voltage $V_{BS}$ may be set to zero volts ($V_{BS}=0V$). In the present example the bulk potential depends on the source potential (corresponds to the voltage between source terminal and ground), wherein the bulk potential is fixedly tied to ground potential (0 volts) in the previous embodiment of FIG. 4). This may reduce possible errors due to asymmetries of the MagFET, for example, when the distances $d_1$ and $d_2$ (see FIG. 2) are not exactly equal or when the channel resistance exhibits some anisotropy.

Figure 7:
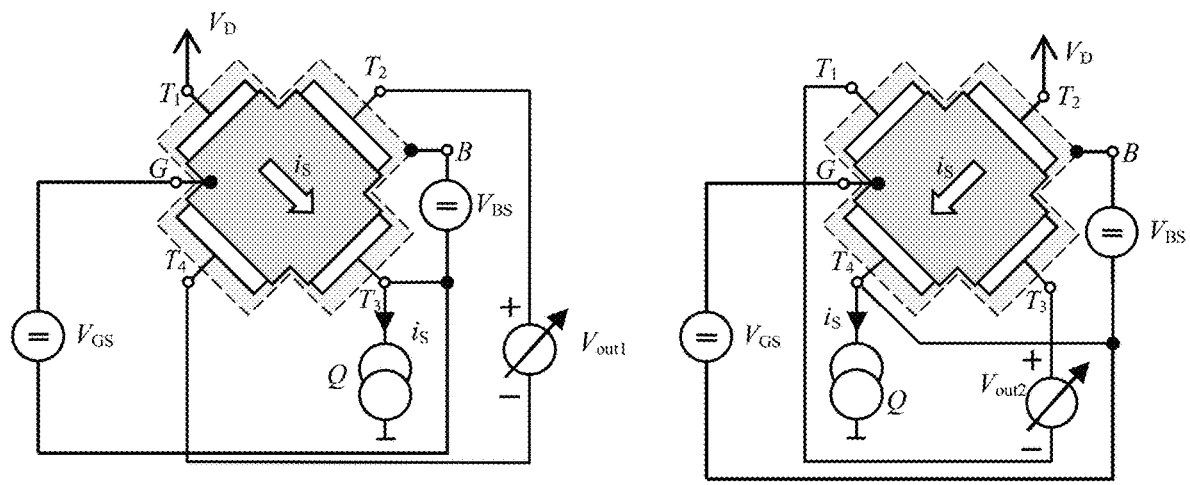
FIG. 7 illustrates a fourth example of a sensor circuit including the MagFET of FIG. 3A and a respective biasing circuit for the MagFET.

The example of FIG. 7 is essentially the same as the previous example of FIG. 6 except that the gate electrode is not biased with a gate voltage $V_G$ with respect to ground potential but rather with a gate-source voltage $V_{GS}$, which is applied between the gate terminal G and the source terminal (i.e. terminal $T_3$ in the first configuration and terminal $T_4$ in the second configuration). This may also reduce potential errors due to asymmetries of the MagFET, for example, when the distances $d_1$ and $d_2$ (see FIG. 2) are not exactly equal, which may lead to different source voltages in the first and the second configuration (see left and right diagram of FIG. 7).

Figure 8:
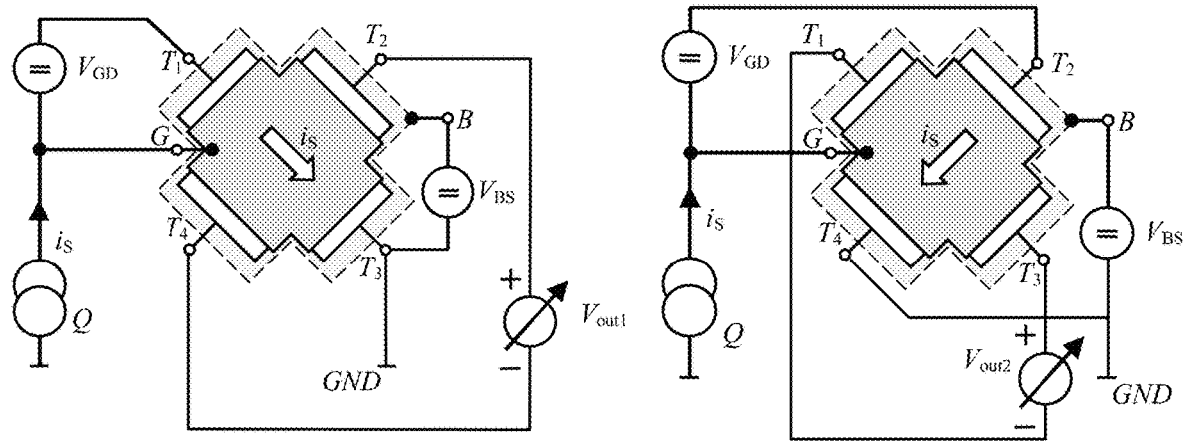
FIG. 8 illustrates a fifth example of a sensor circuit including the MagFET of FIG. 3A and a respective biasing circuit for the MagFET.

The example of FIG. 8 is similar to the example of FIG. 5, in which the gate electrode of the MagFET is charged by current source Q and the source terminal (terminal $T_3$ in the first configuration and terminal $T_4$ in the second configuration) is connected to ground potential. In addition to the example of FIG. 5, a specific bulk voltage $V_{BS}$ is applied between the bulk terminal B and the source terminal instead of connecting the bulk terminal B to ground potential (as it is done in the example of FIG. 5). Furthermore, a constant voltage offset $V_{DG}$ is provided between the drain terminal (terminal $T_1$ in the first configuration and terminal $T_2$ in the second configuration) and the gate terminal G. In one specific example the voltage offset $V_{DG}$ may be zero ($V_{DG}=0V$). During operation, the current source Q charges the gate electrode such that the gate voltage is high enough that the MagFET is able to sink the sensor current $i_S$ provided by the current source Q.

Figure 9:
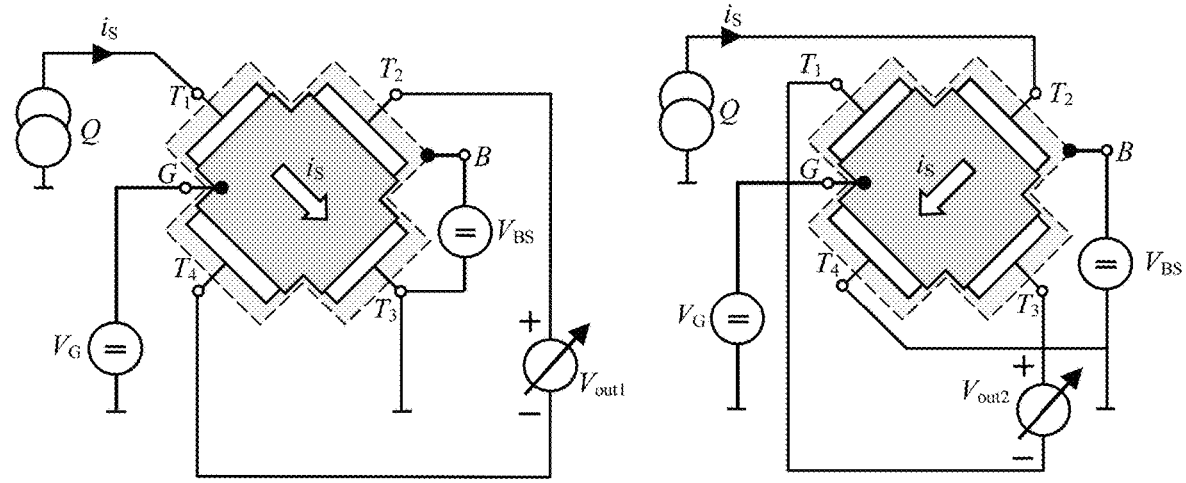
FIG. 9 illustrates a sixth example of a sensor circuit including the MagFET of FIG. 3A and a respective biasing circuit for the MagFET.

The example of FIG. 9 is also similar to the example of FIG. 5, in which the drain terminal (terminal $T_1$ in the first configuration and terminal $T_2$ in the second configuration) is connected to current source Q and the source terminal (terminal $T_3$ in the first configuration and terminal $T_4$ in the second configuration) is connected to ground potential. In addition to the example of FIG. 5, a specific bulk voltage $V_{BS}$ is applied between the bulk terminal B and the source terminal instead of connecting the bulk terminal B to ground potential (as it is done in the example of FIG. 5). Different from the example of FIG. 5, the gate electrode is not charged by the current source Q but rather supplied with a specific gate voltage $V_G$ provided by a voltage source. In specific examples the voltages $V_{BS}$ maybe zero.

In the example of FIG. 9 the MagFET is substantially operated as a current source, which acts against the current source Q connected to the drain terminal. Therefore, the voltage source has to provide a gate voltage $V_G$ that is high enough that the MagFET is able to sink the current $i_S$ provided by current source Q. FIGS. 10A-10B illustrate two exemplary implementations of a voltage source generating the gate voltage $V_G$ for the MagFET of FIG. 9. Both examples of FIGS. 10A-10B include a further MagFET, which has a layout that is identical to the MagFET of FIG. 9. In both implementations the gate terminal G of the further MagFET is connected to the drain terminal, while the source terminal is connected to ground potential. The bulk voltage $V_{BS}$ is set to the same value as for the MagFET of FIG. 9. Furthermore, the current $i_S$ supplied to the drain terminal (by current source Q') is the same as for the MagFET of FIG. 9. In the first implementation shown in FIG. 10A, the terminals $T_1$ and $T_3$ are used as drain and source terminals, respectively, whereas terminals $T_2$ and $T_4$ are not connected. The gate voltage $V_G$ for the MagFET of FIG. 9 is provided by the current source Q' and may be tapped at terminal $T_1$. In the second implementation shown in FIG. 10B, the terminals $T_1$ and $T_2$ are short-circuited and commonly used as drain terminal. Similarly, terminals $T_3$ and $T_4$ are short-circuited and commonly used as source terminal. Like in FIG. 10A, the gate voltage $V_G$ for the MagFET of FIG. 9 is provided by the current source Q' and may be tapped at terminal $T_1$. In a further implementation (not shown), which is based in the implantation of FIG. 10A, drain and source terminals may be swapped in synchronization with the change of operating modes (configuration change from first to second configuration and vice versa) of the example of FIG. 9.

As mentioned above, electronic switches may be used to switch between the first and second configurations in the embodiments of FIGS. 4 to 9. During operation of the MagFET sensor the circuits for biasing a MagFET are alternately switched to the first configuration and to the second configuration. The switching between the first and second operating modes entails a rotation of the global current flow direction through the MagFET. Therefore, the concept is also referred to as spinning current mode. A specific spinning current scheme may be achieved by changing configuration of the biasing circuit coupled to a MagFET. In different configurations the load terminals (drain or source terminals) $T_1$, $T_2$, $T_3$ and $T_4$, may be alternatingly configured as drain terminal, source terminal or sense terminals (between which the output voltage is tapped).

In the first operating mode the circuits of FIGS. 4 to 9 are connected in the first configuration (left diagrams of FIGS. 4 to 9) and in the second operating mode the circuits of FIGS. 4 to 9 are connected in the second configuration (right diagrams of FIGS. 4 to 9). To obtain a measured value representing the magnetic flux density B (see FIG. 1) the output voltage $V_{out1}$ generated in the first operating mode and the output voltage $V_{out2}$ generated in the second operating mode are combined by adding or averaging the output voltages $V_{out1}$ and $V_{out2}$. By adding or averaging the output voltages $V_{out1}$ and $V_{out2}$ an offset error is reduced or, in the best case, substantially eliminated. Basically, the offset error is caused by unavoidable asymmetries of the MagFET layout, e.g. when distance $d_1$ is not exactly equal to distance $d_2$ (see FIG. 2), the doping is not perfectly uniform, etc.

There are various options to sum or average the output voltages $V_{out1}$ and $V_{out2}$ generated by the circuits of FIGS. 4 to 9 in the first and second operating modes, respectively. In fact averaging and adding is practically the same as the sum is always proportional to the average. For example, the circuits may operate in the first operating mode for a time period $t_1$ and in the second operating mode for a time period $t_2$. The output voltage $V_{out1}$ and $V_{out2}$ may be supplied to an integrator, which produces an integrator output proportional to $V_{out1} \cdot t_1 + V_{out2} \cdot t_2$. If the time periods $t_1$ and $t_2$ are equal the integrator output is proportional to the sum $V_{out1} + V_{out2}$. The integrator may be reset after a specific number of cycles, wherein one cycle includes one period in the first configuration and one period in the second configuration.

Another option for adding or averaging the output voltages $V_{out1}$ and $V_{out2}$ includes charging a capacitor $C_1$ by applying the output voltage $V_{out1}$ to the capacitor during the first mode of operation and charging a capacitor $C_2$ by applying the output voltage $V_{out2}$ to the capacitor during the second mode of operation. The charges $Q_1$ and $Q_2$ stored in the capacitors $C_1$ and $C_2$, respectively, are $Q_1 = V_{out1} \cdot C_1$ and $Q_2 = V_{out2} \cdot C_2$. To obtain the sum the capacitors are disconnected from the MagFET and connected in parallel and thus the charges add up to $Q = Q_1 + Q_2$ and the capacitances to $C = C_1 + C_2$. The voltage drop $V_{out}$ across the parallel circuit of capacitor $C_1$ and $C_2$ can be calculated as $V_{out} = (V_{out1} \cdot C_1 + V_{out2} \cdot C_2)/C$. If the capacitors are equal, the expression simplifies to $V_{out} = (V_{out1} + V_{out2})/2$, which is exactly the average of the output voltages $V_{out1}$ and $V_{out2}$.

With exception of the example of FIG. 4, the gate voltage, the bulk voltage or both are tied to the drain or source voltage of the MagFET (directly or via a constant voltage source). As the ohmic resistance of the MOS channel 110 (see FIG. 1) may be different between the current paths between terminals $T_1$ and $T_3$ and terminals $T_2$ and $T_4$ (e.g., due to some asymmetry in the layout) the bulk or gate voltage may be slightly different in the first and second modes of operation. However, gate and bulk voltage may significantly influence the thickness t of the channel region 110 and the electron density n therein. Dependent on the application it may be thus important to maintain at least one of the voltages $V_{GB}$ and $V_{BS}$ (gate-bulk-voltage and bulk-source-voltage) at the same level throughout the different modes of operation, although the absolute voltage (with respect to ground potential) at the gate terminal G or bulk terminal B may vary due to mode changes.

The following table illustrates, which voltages are identical in the first and the second mode of operation and which voltages vary due to mode changes.

| example of | gate-bulk voltage $V_{GB}$ | drain-gate voltage $V_{DG}$ | bulk-source voltage $V_{BS}$ | drain-bulk voltage $V_{DB}$ |
|---|---|---|---|---|
| FIG. 4 | identical | identical | varies | identical |
| FIG. 5 | varies | identical | identical | varies |
| FIG. 6 | varies | identical | identical | varies |
| FIG. 7 | identical | varies | identical | varies |
| FIG. 8 | varies | identical | identical | varies |
| FIG. 9 | identical | varies | identical | varies |

In view of the embodiments shown in FIGS. 4 to 9 a skilled person will understand that minor modifications to the depicted examples are needed to make either the gate-bulk voltage $V_{GB}$ equal in both operating modes or to make the drain-gate voltage $V_{DG}$ equal in both operating modes.

FIG. 11 illustrates an alternative embodiment of a MagFET device, which has—in addition to a gate terminal G and a bulk terminal B—only three load/sense terminals $T_1$, $T_2$, $T_3$ (whereas the previous example of FIG. 3A has four). To allow a symmetric set-up in all configurations (and thus during all operation modes of a spinning current scheme), the MagFET of FIG. 11 may have a substantially hexagonal layout and the three sensor current terminals $T_1$, $T_2$, and $T_3$ may have an angular spacing of 120 degrees. FIG. 11 illustrates the p-well 102 which may be integrated in an n-doped substrate 101 (not explicitly shown in FIG. 11) similar to the example of FIG. 1. The terminals $T_1$, $T_2$, and $T_3$ provide an electric contact to n-doped regions 103, 104, and 105, respectively. The gate electrode 120 covers the surface of the semiconductor body in the area of the p-well 102 between the regions 103, 104, and 105. The gate terminal G may be electrically connected to the gate electrode 120 via gate contact 120' and the bulk terminal B contacts the p-well 103 via a p-well contact region 103'. The region 103' is p-doped with a higher concentration of dopants than the p-well 102. Different from the previous examples of FIGS. 4 to 9, the load terminals are used as sense terminals at the same time in all operating modes. In particular, the two drain (split drain) terminals are used as sense terminals, at which the output voltage is tapped During operation of the MagFET, one of the load/sense terminals $T_1$, $T_2$, and $T_3$ takes over the function of a source terminal and the remaining two terminals commonly take over the functions of so-called split drain terminals, which, at the same time, are also used as sense terminals, at which the output voltage is tapped. As the device has a layout that is substantially symmetric (rotational symmetry of order 3) a spinning current scheme may be implemented, wherein the global current flow direction is rotated by 120° when changing from one operating mode into the subsequent operating mode. In each operating mode, the biasing circuit coupled to the MagFET is configured differently. In the present example, three different configurations may be used in three different modes of operation of a spinning current scheme.

In a first operating mode, terminal $T_1$ acts as source terminal and terminals $T_2$ and $T_3$ act as split drain terminals: In a second operating mode, terminal $T_2$ acts as source terminal and terminals $T_3$ and $T_1$ act as split drain terminals. Finally, in a third operating mode, terminal $T_3$ acts as source terminal and terminals $T_1$ and $T_2$ act as split drain terminals. The following FIGS. 12, 13, 15, and 16 illustrate three exemplary circuits that may be used to bias a split-drain MagFET as illustrated in FIG. 11. Finally, the output voltages $V_{out1}$, $V_{out2}$, and $V_{out3}$ generated in the three modes are combined by summation or averaging similar as discussed with reference to the embodiments described above. As indicated above, a specific spinning current scheme may be implemented by changing the configurations of the biasing circuit coupled to the MagFET in a specific order. In different configurations the load terminals (drain or source terminals) $T_1$, $T_2$, and $T_3$ of the MagFET are alternatingly configured as first drain terminal, first source terminal, wherein the output voltage is tapped between the first and the second drain terminal. To obtain the final output voltage, which can be regarded as a measured value representing the magnetic flux, the output voltages obtained in each operating mode are added or averaged as described above with reference to FIGS. 3A to 10B. In a more generic example, the semiconductor region forming the p-well 102 has a center of symmetry and the contact regions (in the present example regions 103, 104, and 105) are arranged rotationally symmetric with respect to the center of symmetry with a rotational symmetry of order N. In the present example, N equals 3. In the previous examples of FIG. 3A, N equals 4. The contact regions are arranged at or close to the perimeter of the p-well 103.

FIG. 12 illustrates a biasing circuit and a MagFET 2 in a first configuration for a first operating mode. As mentioned, the terminals $T_1$, $T_2$, and $T_3$ may be "rotated" to switch the circuit over into a second configuration for a second operating mode. Accordingly, the circuit node connected to terminal $T_1$ is connected to terminal $T_2$, the circuit node connected to terminal $T_2$ is connected to terminal $T_3$, and the circuit node connected to terminal $T_3$ is connected to terminal $T_1$. Further "rotation" of the terminals yields a third configuration for a third operating mode. A third rotation brings the circuit back into the first configuration due to the mentioned rotational symmetry of order three of the MagFET layout. Electronic switches, which are not shown in the figures to keep the illustrations simple, may be used to switch between the first and second configurations. In the example of FIG. 12 the source terminal (terminal $T_3$ in the depicted first configuration) is coupled with a first current source $Q_1$ sinking a defined source current $i_S$ (sensor current), while a defined gate voltage $V_G$ is applied at gate terminal G and a defined bulk voltage $V_B$ is applied at bulk terminal B. A first one of the drain terminals (terminals $T_1$ in the depicted first configuration) is supplied with supply voltage $V_D$ whereas a second one of the drain terminals (terminals $T_2$ in the depicted first configuration) is connected to a second current source $Q_2$ providing a current equal to half of the source current $i_S$. In the first configuration, the output voltage $V_{out1}$ is tapped between the split drain terminals (i.e. terminals $T_1$ and $T_2$), in the second configuration, the output voltage $V_{out2}$ is tapped between the split drain terminals (i.e. terminals $T_2$ and $T_3$), and in the third configuration, the output voltage $V_{out3}$ is tapped between the split drain terminals (i.e. terminals $T_3$ and $T_1$). Theoretically, in case of an ideal MagFET the output voltages $V_{out1}$, $V_{out2}$, and $V_{out3}$ obtained in the different operating modes should be equal for a specific magnetic flux and should be zero in the absence of an external magnetic flux (cf. FIG. 1). However, due to unavoidable asymmetries of the sensor set-up, the output voltages $V_{out1}$, $V_{out2}$, and $V_{out3}$ are subject to undesired offset voltages (which add to the "ideal" output voltages). The mentioned summing or averaging of the output voltages $V_{out1}$, $V_{out2}$, and $V_{out3}$ results in a partial cancellation of the offsets occurring in the different operating modes and thus allows an improved magnetic field measurement.

In the example of FIG. 12 (first configuration), the current source $Q_1$ pulls the source voltage at terminal $T_3$ so low that the MagFET becomes sufficiently conducting to sink the entire source current $i_S$. Gate and bulk voltages $V_G$ and $V_B$ have to be chosen such that, in a steady state, the gate voltage $V_G$ (with respect to ground potential) is larger than the source voltage $V_S$, and the bulk voltage $V_B$ is equal to the source voltage $V_S$ or lower. Dependent on the magnetic flux density B (cf. FIG. 1) the voltage at terminal $T_2$ can be higher than at terminal $T_1$ (supplied with $V_D$) so that the current source $Q_2$ should be able to operate at voltages larger than the supply voltage $V_D$ in order to be able to inject the current $i_S/2$ into the MagFET at terminal $T_2$ for an arbitrary magnetic flux density B.

Generally, three terminals $T_1$, $T_2$, and $T_3$ allow for three factorial, i.e. six (3!=6), different options to connect the MagFET with current source $Q_1$, supply voltage $V_D$ and current source $Q_2$. Therefore, the spinning current scheme explained above can further be refined by adding three additional configurations (fourth to sixth configuration). Accordingly, the fourth configuration is obtained from the first configuration by interchanging the connections of terminals $T_1$ and $T_3$ (i.e. supply voltage $V_D$ connected to terminal $T_3$ instead of $T_1$ and current source $Q_1$ connected to terminal $T_1$ instead of $T_3$). The fifth configuration is obtained from the second configuration by interchanging the connections of terminals $T_2$ and $T_1$ (i.e. supply voltage $V_D$ connected to terminal $T_1$ instead of $T_2$ and current source $Q_1$ connected to terminal $T_2$ instead of $T_1$). Similarly, the sixth configuration is obtained from the third configuration by interchanging the connections of terminals $T_3$ and $T_2$ (i.e. supply voltage $V_D$ connected to terminal $T_2$ instead of $T_3$ and current source $Q_1$ connected to terminal $T_3$ instead of $T_2$). In each of the six configurations and respective operating modes the output voltages $V_{out1}$ to $V_{out6}$ are tapped between the two split drain terminals. In the examples described herein, the currents provided by current sources $Q_1$ and $Q_2$ remain constant throughout all operating modes. As mentioned the output voltages obtained during the different operating modes may be averaged or added to obtain a total output voltage as a measured value representing the magnetic flux density B. The six configurations and respective operating modes of the circuit of FIG. 12 are summarized in the table below.

|  | 1st conf. | 2nd conf. | 3rd conf. | 4th conf. | 5th conf. | 6th conf. |
| --- | --- | --- | --- | --- | --- | --- |
| terminal connected to $V_D$ | $T_1$ | $T_3$ | $T_2$ | $T_3$ | $T_2$ | $T_1$ |
| terminal connected to $Q_2$ | $T_2$ | $T_1$ | $T_3$ | $T_2$ | $T_1$ | $T_3$ |
| terminal connected to $Q_1$ | $T_3$ | $T_2$ | $T_1$ | $T_1$ | $T_3$ | $T_2$ |
| $V_{outi}$ tapped between | $T_1, T_2$ | $T_3, T_1$ | $T_2, T_3$ | $T_3, T_2$ | $T_2, T_1$ | $T_1, T_3$ |

Figure 13:
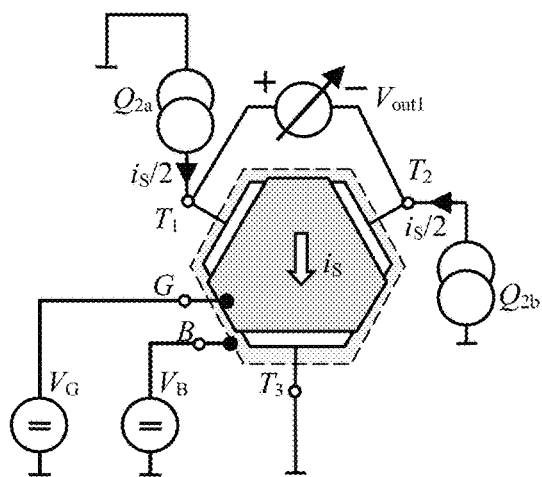
FIG. 13 illustrates a second example of a sensor circuit including the MagFET of FIG. 11 and a respective biasing circuit for the MagFET.

FIG. 13 illustrates another embodiment of a biasing circuit for the MagFET of FIG. 11. In the present example, the source terminal (terminal $T_3$ in the depicted first configuration) is connected to ground GND. The first drain terminal (terminal $T_1$ in the depicted first configuration) is connected to current source $Q_{2a}$, and the second drain terminal (terminal $T_2$ in the depicted first configuration) is connected to current source $Q_{2b}$, while gate terminal G and bulk terminal B are again supplied with a defined gate voltage $V_G$ and bulk voltage $V_B$, respectively. The source current $i_S$ the sum of the two drain currents and thus equals is. The output voltage $V_{out1}$ is tapped between the two drain terminals. Three different configurations and respective operating modes are possible for the present circuit. The second configuration can be obtained by "rotating" the terminals similar to the previous example. However, as the current sources $Q_{2a}$ and $Q_{2b}$ are substantially identical, only three configurations are available instead of six. However, in practice the currents provided by current sources $Q_{2a}$ and $Q2b$ generally exhibit a small unavoidable mismatch, which might cause some additional offset error. However, these mismatch errors may cancel out in a current spinning scheme by adding an additional conjugate operating mode to each of the three original operating modes. These additional conjugate operating modes are associated with a circuit configuration, in which only the two current sources are swapped. Finally, all output voltages of all six operating modes are combined (e.g. by addition or averaging).

Figure 14A:
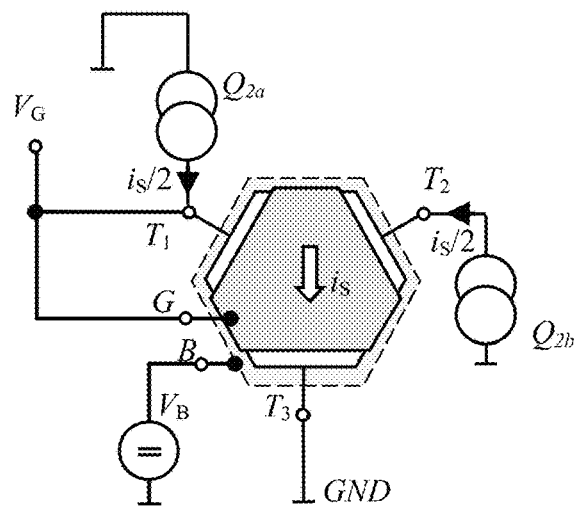
FIGS. 14A-14B illustrate two different exemplary implementations of a voltage source for providing a gate voltage in the sensor circuit of FIG. 13.
Figure 14B:
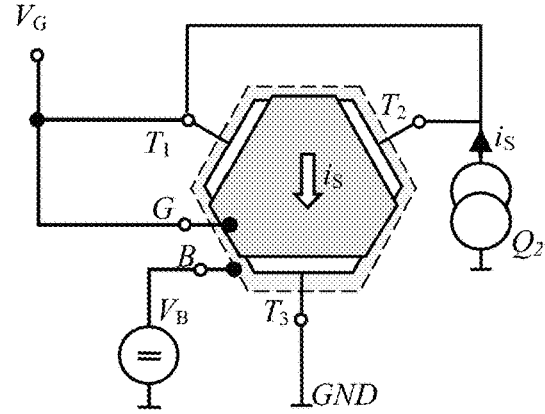

Like in the previous example of FIG. 9 the source of the MagFET is directly connected to ground and thus the gate potential (which is equal to the gate-source voltage in the present example) has to be set high enough (by applying an appropriate gate voltage $V_G$ at terminal G) that the MagFET is able to sink the total drain current $i_S/2 + i_S/2$. FIGS. 14A-14B illustrate two exemplary implementations of voltage sources, which are configured to generate a suitable gate-voltage for the MagFET used with the circuit of FIG. 13. Both examples of FIGS. 14A-14B include a further MagFET, which has a layout that is identical to the MagFET of FIG. 13. The voltage source circuit of FIG. 14A is essentially identical with the circuit of FIG. 13, except that the gate terminal is short-circuited with terminal $T_1$. The gate voltage $V_G$ provided by the voltage source of FIG. 14A therefore is equal to the drain voltage present at terminal $T_1$. In the example of FIG. 14B, the gate terminal is short-circuited with both, the first drain terminal $T_1$ and the second drain terminal $T_2$. Both drain terminals are connected to current source $Q_2$ providing the total drain current $i_S/2$, while the source terminal $T_3$ is connected to ground GND. Analogously to the example of FIG. 14A, the gate voltage $V_G$ provided by the voltage source of FIG. 14B therefore is equal to the drain voltage present at terminal $T_1$. In both circuits of FIGS. 14A and 14B the wire between terminal $T_1$ and the terminal $V_G$ can be replaced by a voltage source, which lifts the gate potential somewhat above the potential at drain terminal $T_1$, to better utilize the available voltage headroom.

Figure 15:
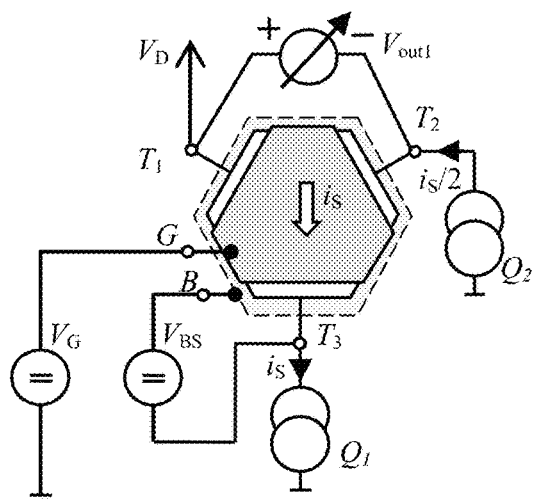
FIG. 15 illustrates a third example of a sensor circuit including the MagFET of FIG. 11 and a respective biasing circuit for the MagFET.
Figure 16:
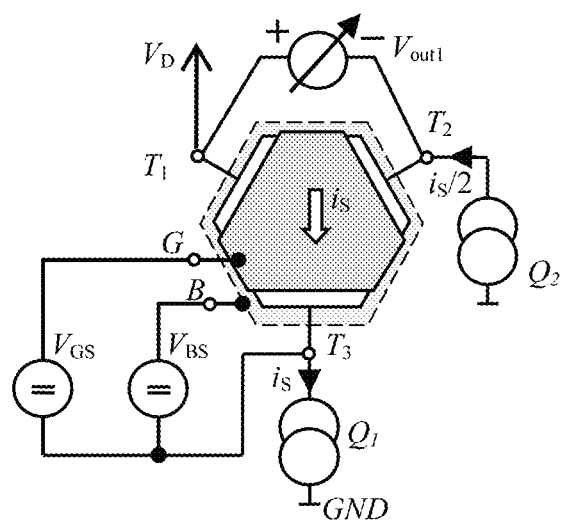
FIG. 16 illustrates a fourth example of a sensor circuit including the MagFET of FIG. 11 and a respective biasing circuit for the MagFET.

FIG. 15 illustrates another embodiment of a biasing circuit for the MagFET of FIG. 11. In essence, the circuit of FIG. 15 is identical with the circuit of FIG. 12 except that the bulk terminal B is not biased with a defined bulk voltage $V_B$ (with respect to ground) but rather with a defined bulk-source voltage $V_{BS}$. The respective voltage source, which provides the voltage $V_{BS}$, is therefore connected between the bulk terminal B and the source terminal $T_3$. Therefore, the bulk-source voltage $V_{BS}$ will remain constant, although the source voltage may slightly vary in different operating modes. FIG. 16 illustrates a modification of the biasing circuit for the MagFET of FIG. 15. In essence, the circuit of FIG. 16 is identical with the circuit of FIG. 15 except that the gate terminal G is not biased with a defined gate voltage $V_G$ (with respect to ground) but rather with a defined gate-source voltage $V_{GS}$. The respective voltage source, which provides the gate voltage $V_{GS}$, is therefore connected between the gate terminal G and the source terminal $T_3$. Therefore, the gate-source voltage $V_{GS}$ will remain constant, although the source voltage may slightly vary in different operating modes. The following table illustrates, which voltages are identical in the first, the second and the third mode of operation and which voltages vary due to mode changes (cause a change of the circuit configuration).

| example of | gate-bulk voltage $V_{GB}$ | drain-gate voltage $V_{DG}$ | bulk-source voltage $V_{BS}$ | drain-bulk voltage $V_{DB}$ |
|---|---|---|---|---|
| FIG. 12 | identical | partly identical | varies | varies |
| FIG. 13 | identical | varies | identical | varies |
| FIG. 15 | varies | partly identical | identical | varies |
| FIG. 16 | identical | partly identical | identical | partly identical |

In the above table, "partly identical" means that only one of both drain terminals has identical source-gate or drain-bulk voltage in at least two operating modes of a spinning current scheme.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for operating a magnetic-field-sensitive MOSFET (MagFET) comprising a gate terminal, a bulk terminal, and at least three load terminals operably coupled to a biasing circuit, the method comprising:
    rotatably connecting the biasing circuit and the MagFET in a first configuration, a second configuration, and a third configuration to rotatably operate the MagFET in a first operating mode, a second operating mode, and a third operating mode;
    tapping output voltages at the MagFET in the first operating mode, the second operating mode, and the third operating mode;
    combining the output voltages tapped at the MagFET in the first operating mode, the second operating mode, and the third operating mode; and
    maintaining at least one of a gate-bulk voltage or a bulk-source voltage constant throughout alternating between the first operating mode, the second operating mode, and the third operating mode,
        wherein the gate-bulk voltage is between the gate terminal and the bulk terminal,
        wherein the bulk-source voltage is between a load terminal, of the at least three load terminals, that acts as a source terminal and the bulk terminal,
        wherein, when operating in the first operating mode, a first load terminal, of the at least three load terminals, acts as the source terminal, and a second load terminal and a third load terminal, of the at least three load terminals, act as split drain terminals,
        wherein, when operating in the second operating mode, the second load terminal acts as the source terminal, and the first load terminal and the third load terminal act as the split drain terminals, and
        wherein, when operating in the third operating mode, the third load terminal acts as the source terminal, and the first load terminal and the second load terminal act as the split drain terminals.

2. The method of claim 1, wherein, in the first configuration, the biasing circuit provides a sensor current to or sinks the sensor current from the first load terminal, and
    wherein, in the second configuration, the biasing circuit provides the sensor current to or sinks the sensor current from the second load terminal.

3. The method of claim 2, wherein the sensor current passing through a channel region of the MagFET is identical in the first configuration and the second configuration.

4. The method of claim 1, wherein the MagFET comprises four load terminals,
    wherein, in the first operating mode, the biasing circuit generates a sensor current passing from the first load terminal to the second load terminal while the output voltages are tapped between the third load terminal and a fourth load terminal of the four load terminals, and
    wherein, in the second operating mode, the biasing circuit generates a sensor current passing through the MagFET from the third load terminal to the fourth load terminal while the output voltages are tapped between the first load terminal and the second load terminal.

5. The method of claim 1, wherein the MagFET comprises three load terminals;
    wherein, in the first operating mode, the biasing circuit generates a sensor current passing through the first load terminal, and
    wherein the sensor current is split in a channel region of the MagFET so that a first fraction of the sensor current passes through the second load terminal and a second fraction of the sensor current passes through the third load terminal while the output voltages are tapped between the second load terminal and the third load terminal.

6. The method of claim 5, wherein the sensor current is a first sensor current;
    wherein, in the second operating mode, the biasing circuit generates a second sensor current passing through the second load terminal, and
    wherein the second sensor current is split in the channel region of the MagFET so that a first fraction of the second sensor current passes through the third load terminal and a second fraction of the second sensor current passes through the first load terminal while the output voltages are tapped between the third load terminal and the first load terminal.

7. The method of claim 1, further comprising:
rotating a current flow direction based on rotating from the first configuration to the second configuration.

8. A magnetic field sensor, comprising:
a magnetic-field-sensitive MOSFET (MagFET) comprising a gate terminal, a bulk terminal, and at least three load terminals;
a biasing circuit that is configured to be connected to the MagFET in a first configuration to operate the MagFET in a first operating mode, in a second configuration to operate the MagFET in a second operating mode, and a third configuration to operate the MagFET in a third operating mode,
the biasing circuit comprising electronic switches for reconfiguring the biasing circuit when changing between the first operating mode, the second operating mode, and the third operating mode; and
an evaluation circuit configured to combine output voltages tapped at the MagFET in the first operating mode, the second operating mode, and the third operating mode to obtain a measured value representing a magnetic field,
wherein the biasing circuit is configured to provide a constant voltage value for at least one of a gate-bulk voltage or a bulk-source voltage throughout the first operating mode, the second operating mode, and the third operating mode,
the gate-bulk voltage being between the gate terminal and the bulk terminal, and
the bulk-source voltage being between a load terminal, of the at least three load terminals, that acts as a source terminal and the bulk terminal,
wherein, when operating in the first operating mode, a first load terminal, of the at least three load terminals, acts as the source terminal, and a second load terminal and a third load terminal, of the at least three load terminals, act as split drain terminals,
wherein, when operating in the second operating mode, the second load terminal acts as the source terminal, and the first load terminal and the third load terminal act as the split drain terminals, and
wherein, when operating in the third operating mode, the third load terminal acts as the source terminal, and the first load terminal and the second load terminal act as the split drain terminals.

9. The magnetic field sensor of claim 8, wherein, in the first configuration, the biasing circuit provides a sensor current to or sinks the sensor current from the first load terminal, and
wherein, in the second configuration, the biasing circuit provides the sensor current to or sinks the sensor current from the second load terminal.

10. The magnetic field sensor of claim 8, wherein the biasing circuit is configured to generate a sensor current passing through a channel region of the MagFET,
the sensor current being identical in the first operating mode and the second operating mode.

11. The magnetic field sensor of claim 8, wherein the MagFET comprises four load terminals,
wherein the biasing circuit is configured to generate, in the first operating mode, a sensor current that passes from the first load terminal to the second load terminal while the output voltages are tapped between the third load terminal and a fourth load terminal of the four load terminals, and
wherein the biasing circuit is configured to generate, in the second operating mode, a sensor current that passes through the MagFET from the third load terminal to the fourth load terminal while the output voltages are tapped between the first load terminal and the second load terminal.

12. The magnetic field sensor of claim 8, wherein the MagFET comprises three load terminals;
wherein the biasing circuit is configured to generate, in the first operating mode, a sensor current that passes through the first load terminal,
wherein the sensor current is split in a channel region of the MagFET so that a first fraction of the sensor current passes through the second load terminal and a second fraction of the sensor current passes through the third load terminal while the output voltages are tapped between the second load terminal and the third load terminal.

13. The magnetic field sensor of claim 9, wherein the biasing circuit is configured to generate, in the first operating mode, the sensor current so that the sensor current passes through the second load terminal,
wherein the sensor current is split in a channel region of the MagFET so that a first fraction of the sensor current passes through the third load terminal and a second fraction of the sensor current passes through the first load terminal while the output voltages are tapped between the third load terminal and the first load terminal.

14. The magnetic field sensor of claim 8, wherein the biasing circuit includes at least one current source.

15. The magnetic field sensor of claim 8, wherein a current flow is rotated 120 degrees when changing from the first operating mode to the second operating mode.

16. A magnetic-field-sensitive MOSFET (MagFET), comprising:
a semiconductor body;
a first well region arranged in the semiconductor body and doped with dopants of a first doping type;
three contact regions arranged in the first well region and doped with dopants of a second doping type,
the second doping type being complementary to the first doping type; and
a gate electrode covering the first well region between the three contact regions,
the gate electrode being separated from the first well region by an isolation layer, and
the gate electrode being configured to control a charge carrier density in the first well region between the three contact regions dependent on a voltage applied at the gate electrode;
wherein the first well region has a center of symmetry and the three contact regions are arranged rotationally symmetric with respect to the center of symmetry with a rotational symmetry of order three;
wherein the MagFET is configured to rotatably operating in three different operating modes;
wherein, when operating in a first operating mode of the three different operating modes, a first load terminal acts as a source terminal, and a second load terminal and a third load terminal act as split drain terminals;
wherein, when operating in a second operating mode of the three different operating modes, the second load terminal acts as the source terminal, and the first load terminal and the third load terminal act as the split drain terminals; and wherein, when operating in a third operating mode of the three different operating modes, the third load terminal acts as the source terminal, and the first load terminal and the second load terminal act as the split drain terminals.

17. The MagFET of claim 16, wherein the three contact regions are configured to provide an ohmic contact to a channel region that emerges in the first well region along a surface of the semiconductor body when generating a sufficient gate potential in the gate electrode.

18. The MagFET of claim 16, wherein the first well region has a layout which is substantially hexagonal or octagonal.

19. The MagFET of claim 16, wherein the semiconductor body is doped with dopants of the second doping type.

20. The MagFET of claim 16, wherein the three contact regions are arranged at or adjacent to a perimeter of the first well region.

* * * * *